(12) United States Patent
Morino

(10) Patent No.: US 9,972,612 B2
(45) Date of Patent: May 15, 2018

(54) SEMICONDUCTOR DEVICE

(71) Applicant: DENSO CORPORATION, Kariya, Aichi-pref. (JP)

(72) Inventor: Tomoo Morino, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/547,082

(22) PCT Filed: May 16, 2016

(86) PCT No.: PCT/JP2016/002392
§ 371 (c)(1),
(2) Date: Jul. 28, 2017

(87) PCT Pub. No.: WO2016/203705
PCT Pub. Date: Dec. 22, 2016

(65) Prior Publication Data
US 2018/0026021 A1 Jan. 25, 2018

(30) Foreign Application Priority Data
Jun. 18, 2015 (JP) .................................. 2015-122981

(51) Int. Cl.
*H01L 23/34* (2006.01)
*H01L 25/18* (2006.01)
(Continued)

(52) U.S. Cl.
CPC .............. *H01L 25/18* (2013.01); *H01L 23/16* (2013.01); *H01L 23/492* (2013.01); *H01L 24/32* (2013.01);
(Continued)

(58) Field of Classification Search
CPC ....... H01L 24/32; H01L 23/492; H01L 23/16; H01L 25/18
(Continued)

(56) References Cited

U.S. PATENT DOCUMENTS 7,091,603 B2 *  8/2006  Mamitsu ............... H01L 21/565
257/276
7,843,700 B2 * 11/2010  Fukuda ................ H01L 21/565
361/760

(Continued)

FOREIGN PATENT DOCUMENTS

JP     2006-020405 A    1/2006
JP     2010-080782 A    4/2010
(Continued)

*Primary Examiner* — Luan C Thai
(74) *Attorney, Agent, or Firm* — Posz Law Group, PLC

(57) ABSTRACT

A semiconductor device includes: a first element formed of a first constituent as a main constituent; a second element formed of a second constituent as a main constituent; a heat sink on which the first element and the second element are disposed; a first connection layer electrically connecting the first element to the heat sink; a second connection layer electrically connecting the second element to the heat sink; and a mold resin covering and protecting the first element, the second element and the heat sink. Sizes of the first element and the second element are set so that an equivalent plastic strain increment of the first connection layer is greater than the second connection layer. Accordingly, in the semiconductor device including semiconductor elements formed of different constituents, the elements are thermally protected without providing a temperature detector to the semiconductor element formed of one of the constituents.

6 Claims, 4 Drawing Sheets

(51) Int. Cl.
*H01L 23/492* (2006.01)
*H01L 23/16* (2006.01)
*H01L 23/00* (2006.01)
H01L 29/06 (2006.01)
H01L 29/16 (2006.01)

(52) U.S. Cl.
CPC ...... *H01L 29/0684* (2013.01); *H01L 29/1608* (2013.01); *H01L 2224/32245* (2013.01); *H01L 2224/32501* (2013.01); *H01L 2924/014* (2013.01); *H01L 2924/351* (2013.01)

(58) Field of Classification Search
USPC .......................................................... 257/717
See application file for complete search history.

(56) References Cited

U.S. PATENT DOCUMENTS

| | | | |
|---|---|---|---|
| 2003/0022464 A1 | 1/2003 | Hirano et al. | |
| 2005/0167802 A1 | 8/2005 | Hirano et al. | |
| 2013/0062626 A1 | 3/2013 | Takao et al. | |
| 2013/0135824 A1* | 5/2013 | Harubeppu | H01L 23/34 361/709 |
| 2015/0382506 A1* | 12/2015 | Yamada | H05K 7/20263 361/699 |

FOREIGN PATENT DOCUMENTS

| | | |
|---|---|---|
| JP | 2013-074677 A | 4/2013 |
| JP | 2013-089763 A | 5/2013 |
| JP | 2013-131774 A | 7/2013 |

* cited by examiner

SEMICONDUCTOR DEVICE

CROSS REFERENCE TO RELATED APPLICATIONS

This application is the U.S. national phase of International Patent Application No. PCT/JP2016/002392 filed on May 16, 2016 and is based on Japanese Patent Application No. 2015-122981 filed on Jun. 18, 2015, the disclosure of which is incorporated herein by reference.

TECHNICAL FIELD

The present disclosure relates to a semiconductor device in which multiple elements are driven in parallel.

BACKGROUND ART

Recently, in the semiconductor device in which multiple elements are driven in parallel, a silicon carbide, which is one of semiconductors called as wide band-gap semiconductor, has been employed as a material of a part of the elements. For example, an SiC switching element including SiC as a main constituent has low on-resistance compared to an Si switching element including silicon as a main constituent and can reduce power loss. Also, since the SIC switching element can be operated under high temperature condition compared to the Si switching element, it has been expected to miniaturize a cooling mechanism for the SiC switching element.

A power semiconductor module described in the patent literature 1 includes an inverter in which an insulated gate bipolar transistor (i.e., IGBT) and a free-wheeling diode (i.e., FWD) are connected in parallel. In the above power semiconductor module, the FWD is formed of SiC to reduce recovery loss and switching loss, and thereby to reduce a quantity of heat generated in the FWD. As a result, in addition to characteristics of SiC that can be employed in high temperature region, allowable operating temperature of the FWD is expanded, and miniaturization of the power semiconductor module is achieved by decreasing the performance of the cooling mechanism.

PRIOR ART LITERATURE

Patent Literature

Patent literature 1: JP 2018-181774 A

SUMMARY OF INVENTION

From viewpoints of thermal protection of the elements, it is important to detect degradation of resistance to heat of a member electrically connecting the element to the other member. Conventionally, it has been known that a temperature sensor of a semiconductor such as a PN junction temperature sensor is disposed on the element to detect the temperature and the element is protected from temperature increase larger than a specific value.

However, since the wide band-gap semiconductor is generally expensive, there is a possibility that the cost is increased by adding the temperature sensor of the semiconductor to the element formed of the wide band-gap semiconductor.

It is an object of the present disclosure to provide a semiconductor device including semiconductor elements formed of different constituents and capable of thermally protecting the semiconductor elements without providing a temperature detector to the semiconductor element formed of one of the constituents.

According to an aspect of the present disclosure, a semiconductor device includes at least one first element, at least one second element, a heat sink, a first connection layer, a second connection layer and a mold resin. The first element is formed of a first constituent as a main constituent and has electrodes at a front surface and a rear surface opposite to the front surface. The second element is formed of a second constituent as a main constituent and has electrodes at a front surface and a rear surface opposite to the front surface. The first element and the second element are disposed on the heat sink. The first connection layer electrically connects the electrode at the rear surface of the first element to the heat sink. The second connection layer electrically connects the electrode at the rear surface of the second element to the heat sink. The mold resin covers and protects the first element, the second element and the heat sink. A part of a surface of the heat sink is exposed from the mold resin. Sizes of the first element and the second element are set so that an equivalent plastic strain increment of the first connection layer is greater than an equivalent plastic strain increment of the second connection layer.

According to an aspect of the present disclosure, the amount of strain generated in the first connection layer is greater than the second connection layer. As a result, cracks are likely to be generated in the first connection layer and increment of thermal resistance of the first connection layer is increased. That is, a specific life ends in the first connection layer prior to the second connection layer. Namely, a designer can intentionally control the first connection layer to end the life prior to the second connection layer. When the temperature detector is formed only in the first element connected to the first connection layer and the thermal protection of the elements are performed based on the detected temperature, the second element is restricted to be broken prior to the first element.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Embodiments of the present disclosure will be described with reference to the drawings. In the following drawings, portions that are the same as each other or equal to each other will be designated by the same symbols.

First Embodiment

Figure 1:
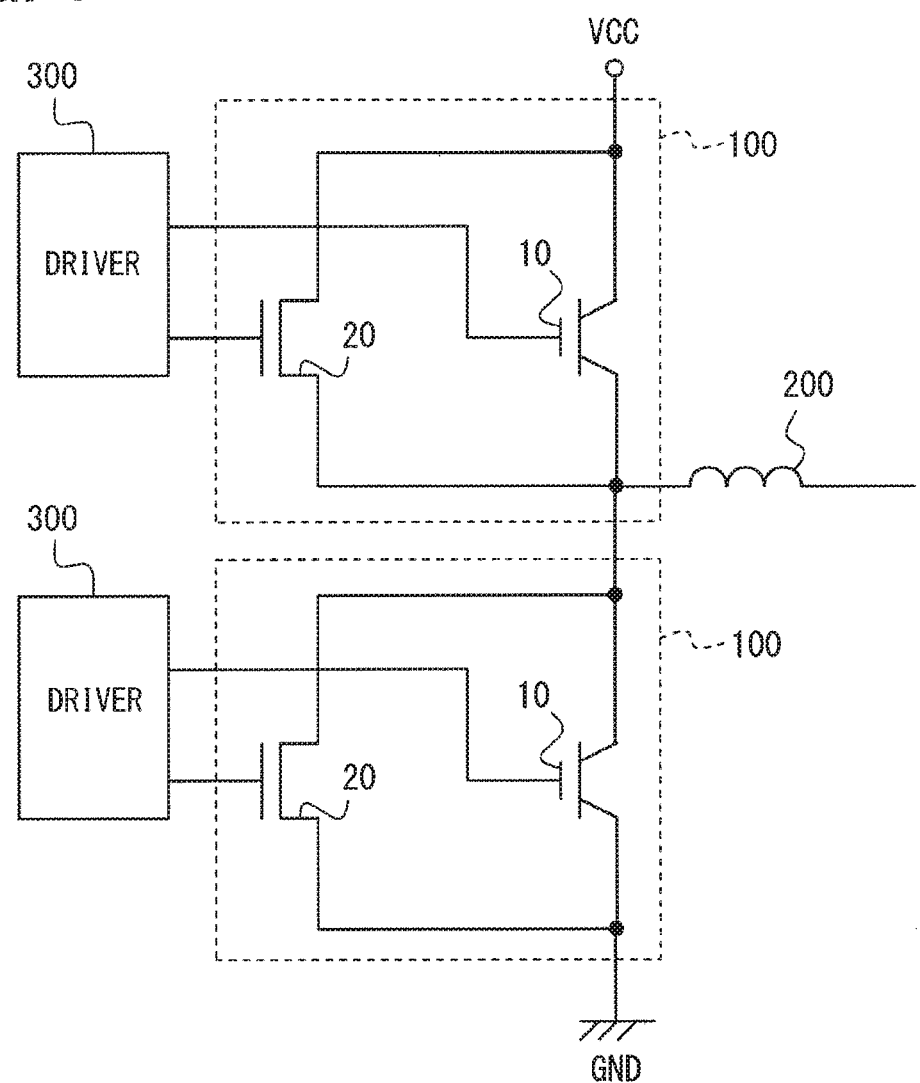
FIG. 1 is a circuit diagram illustrating a circuit structure of a semiconductor device and a peripheral circuit according to a first embodiment.

First, a schematic structure of a semiconductor device according to the present embodiment will be described with reference to FIG. 1 to FIG. 3.

For example, the semiconductor device according to the present embodiment is employed with a switching circuit including two switching elements of MOSFET and IGBT connected in parallel and obtaining output current, The IGBT has a characteristic that generates tail current when the IGBT is turned off. The tail current causes an increase of switching loss when the IGBT is turned off. To manage this, in the semiconductor device having the MOSFET and the IGBT connected in parallel, power consumption resulting from the tail current is suppressed by delaying the off-timing of the MOSFET than the IGBT.

Circuit structures of a semiconductor device 100 and a peripheral circuit according to the present embodiment will be described with reference to FIG. 1. As shown in FIG. 1, the semiconductor device 100 of the present embodiment is a switching circuit. Two semiconductor devices 100 are connected in series between a power source VCC and a ground GND and provide an upper arm and a lower arm. A load 200 is connected between the upper arm and the lower arm. A direction of current flowing in the load 200 is switched by alternately tuning on and off the semiconductor device 100 providing the upper arm and the semiconductor device 100 providing the lower arm. That is, the two semiconductor devices 100 form an inverter.

Since the semiconductor devices 100 providing the upper arm and the lower arm are equal to each other, the semiconductor device 100 providing the upper arm will be hereinafter described.

The semiconductor device 100 includes an IGBT 10 corresponding to a first element and a MOSFET 20 corresponding to a second element. The IGBT 10 and the MOSFET 20 are connected in parallel with the power source VCC. Drivers 300 are respectively connected to gate electrodes of the IGBT 10 and the MOSFET 20 to supply gate voltages to the switching elements 10 and 20. The drives 300 are connected to non-illustrated control device for controlling timings of on/off of the IGBT 10 and the MOSFET 20, and values of gate voltages. The drivers 300 control the IGBT 10 and MOSFET 20 based on command signals received from the control device.

Next, a structure of the semiconductor device 100 will be described with reference to FIG. 2 and FIG. 3. As shown in FIG. 2 and FIG. 3, the semiconductor device 100 includes chips of IGBT 10 and MOSFET 20 as the switching element formed of semiconductor. The semiconductor device 100 includes flat plates of a first heat sink 30 and a second heat sink 40 that dissipate heat generated in the switching elements 10 and 20. The IGBT 10 and the MOSFET 20 are arranged to be sandwiched between the first heat sink 30 and the second heat sink 40. The semiconductor device 100 further includes a first spacer 70 and a second spacer 80 that adjust facing distances between the first heat sink 30 and the second heat sink 40. The semiconductor device 100 includes a mold resin 90 that protects the switching elements 10, 20, the heat sinks 30, 40 and the spacers 70 and 80.

The IGBT 10 has an emitter electrode formed at a front surface of the IGBT 10 and a collector electrode formed at a rear surface opposite to the front surface. As shown in FIG. 3, a first connection layer 50 is interposed between the IGBT 10 and the first heat sink 30 so that the collector electrode of the IGBT 10 is electrically connected to the first heat sink 30 through the first connection layer 50. On the other hand, the MOSFET 20 has a source electrode at a front surface of the MOSFET 20 and a drain electrode at a rear surface opposite to the front surface. As shown in FIG. 3, a second connection layer 60 is interposed between the MOSFET 20 and the first heat sink 30 so that the drain electrode is electrically connected to the first heat sink 30 through the second connection layer 60.

The first heat sink 30 and the second heat sink 40 are flat plates that dissipate the heat generated in the IGBT 10 and the MOSFET 20 to the exterior. The first heat sink 30 and the second heat sink 40 are disposed to face with each other. As described above, the IGBT 10 and the MOSFET 20 are sandwiched with the heat sinks 30 and 40. The second heat sink 40 faces the emitter electrode of the IGBT 10 and the source electrode of the MOSFET 20.

Figure 2:
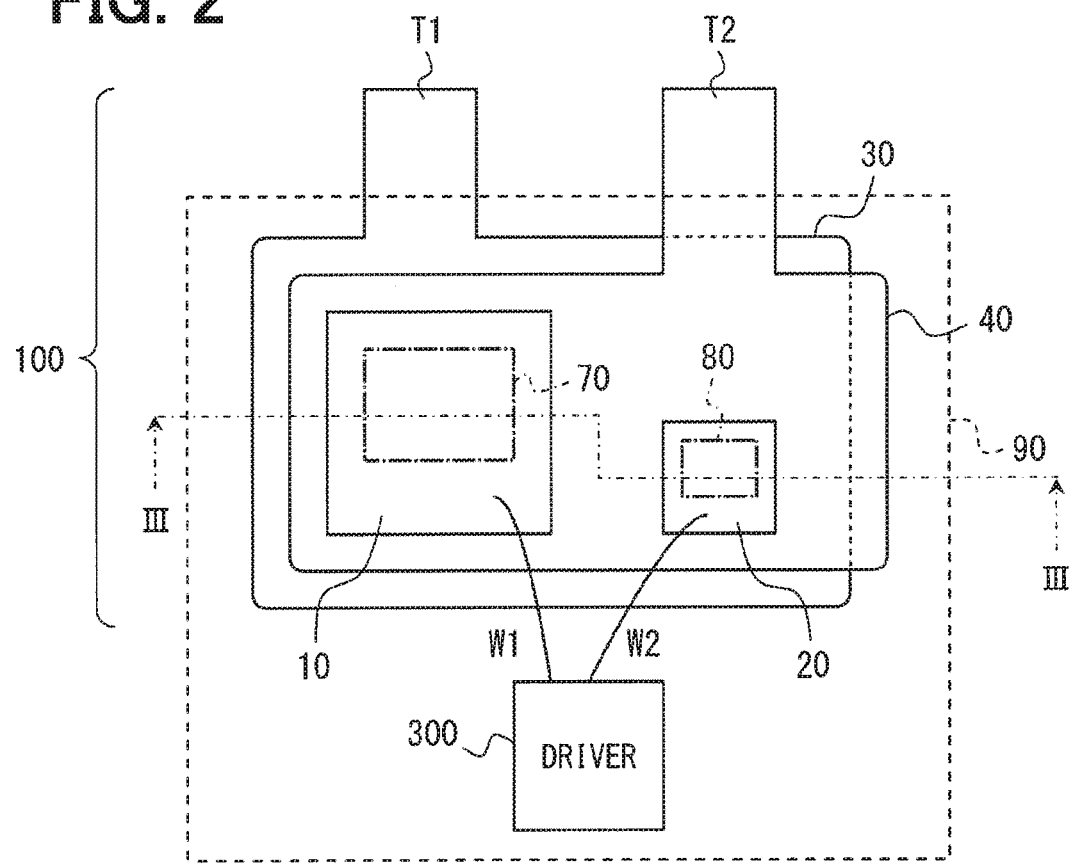
FIG. 2 is a top view illustrating a schematic structure of the semiconductor device.
Figure 3:
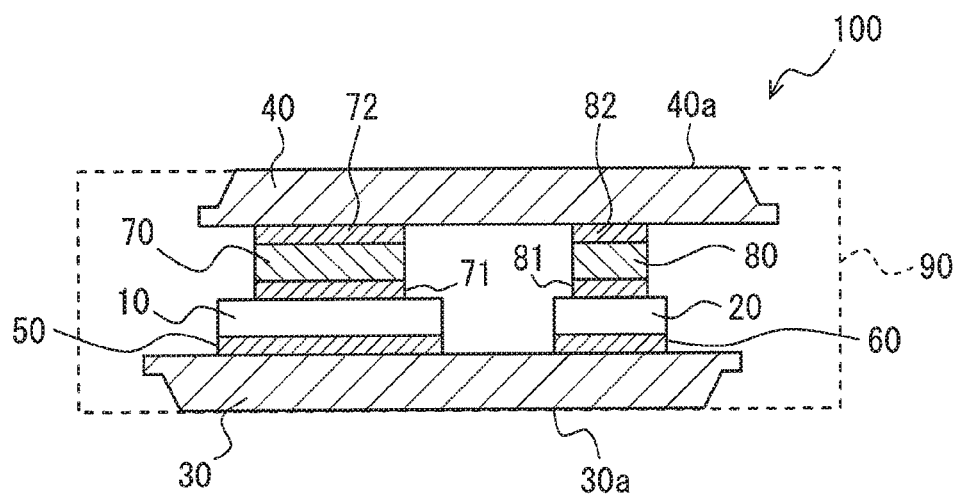
FIG. 3 is a cross-sectional view taken along a line III-III of FIG. 2.

As shown in FIG. 2, the first heat sink 30 has a projection T1 that projects from a part of one side of the flat plate and the projection T1 is connected to the power source VCC. The second heat sink 40 has a projection T2 that projects from a part of one side of the flat plate and the projection T2 is connected to the load 200 and the lower arm.

The second heat sink 40 and the emitter electrode of the IGBT 10 are connected through the first spacer 70. The second heat sink 40 and the source electrode of the MOSFET 20 are connected through the second spacer 80. The spacers 70 and the 80 adjust the facing distance between the first heat sink 30 and the second heat sink 40 so that the first heat sink 30 and the second heat sink 40 are parallel with each other. The spacers 70 and 80 electrically connect the IGBT 10, the MOSFET 20 and the second heat sink 40.

The first spacer 70 is connected to the emitter electrode of the IGBT 10 through a third connection layer 71. The first spacer 70 is connected to the second heat sink 40 through a fourth connection layer 72. On the other hand, the second spacer 80 is connected to the source electrode of the MOSFET 20 through a fifth connection layer 81. The second spacer 80 is connected to the second heat sink 40 through a sixth connection layer 82.

The mold resin 90 is molded to accommodate and protect the IGBT 10, the MOSFET 20, the first spacer 70, the second spacer 80, the first connection layer 50, the second connection layer 60, the third connection layer 71, the fourth connection layer 72, the fifth connection layer 81 and the sixth connection layer 82. The first heat sink 30 is insert-molded so that a surface 30a, on which the IGBT 10 and the MOSFET 20 are not mounted, is exposed to the exterior as shown in FIG. 3, and the projection T1 projects to the exterior as shown in FIG. 2. The second heat sink 40 is insert-molded so that a surface 40a, to which the first spacer 70 and the second spacer 80 are not connected, is exposed to the exterior, and the projection T2 projects to the exterior.

As shown in FIG. 2, in the present embodiment, the driver 300 is accommodated in the mold resin 90. The gate electrodes of the IGBT 10 and the MOSFET 20 and the driver 300 are connected through bonding wires W1 and W2. The driver 300 is not necessarily accommodated in the mold resin 90 together with the semiconductor device 100 and may be located out of the mold resin 90.

The IGBT 10 of the present embodiment is formed of silicon corresponding to a first constituent as a main constituent. The MOSFET 20 is formed of silicon carbide corresponding to a second constituent as a main constituent. The first heat sink 30, the second heat sink 40, the first spacer 70 and the second spacer 80 are formed of copper as a main constituent. The first connection layer 50, the second connection layer 60, the third connection layer 71, the fourth connection layer 72, the fifth connection layer 81 and the sixth connection layer 82 are formed of well-known solder. The third connection layer 71, the fourth connection layer 72, the fifth connection layer 81 and the sixth connection layer 82 are respectively thinner than the first connection layer 50 and the second connection layer 60.

Figure 4:
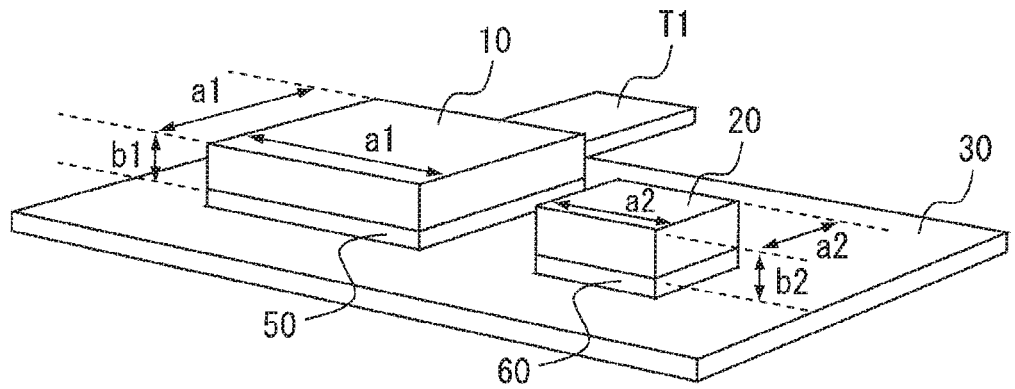
FIG. 4 is a perspective view illustrating a detailed structure of a part of the semiconductor device.
Figure 5:
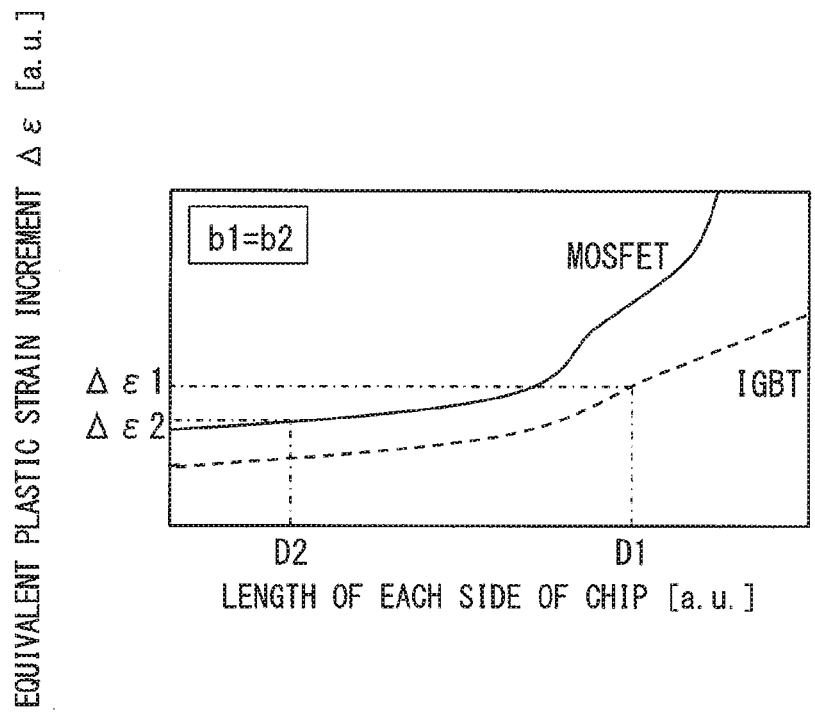
FIG. 5 is a diagram illustrating a variation of equivalent plastic strain increment with respect to a length of one side of a chip.

Next, shapes of the IGBT 10 and the MOSFET 20 will be described with reference to FIG. 4 and FIG. 5. In FIG. 4, illustrations of elements other than the IGBT 10, the MOSFET 20, the first connection layer 50, the second connection layer 60 and the first heat sink 30 are omitted.

The IGBT 10 has a square shape when a flat plate surface of the first heat sink 30 is viewed in a planar surface. In other words, the front surface, at which the emitter electrode is formed, or the rear surface, at which the collector electrode is formed, has a square shape. As shown in FIG. 4, a length of each side of the square shape is expressed as a1. A thickness of the chip of the IGBT 10 is expressed as b1.

In this case, an equivalent plastic strain increment $\Delta\epsilon1$ is generated in the first connection layer 50 formed of solder as a main constituent. The equivalent plastic strain increment $\Delta\epsilon1$ is defined by a formula $\Delta\epsilon1=(0.004b1+0.0003)a1^2+0.26$. The formula defining the $\Delta\epsilon1$ is a formula obtained by fitting, to a function, an equivalent plastic strain increment calculated by computer simulation with the length a1 and the thickness b1 as variables. In the computer simulation, specific physical quantities (e.g., Young' modulus, Poisson's ratio or liner expansion coefficient) of the silicon of the IGBT 10 and the solder of the first connection layer 50 are employed.

The MOSFET 20 has a square shape when a flat plate surface of the first heat sink 30 is viewed in a planar surface. In other words, the front surface, at which the source electrode is formed, or the rear surface, at which the drain electrode is formed, has a square shape. As shown in FIG. 4, a length of each side of the square shape is expressed as a2. A thickness of the chip of the MOSFET 20 is expressed as b2.

In this case, an equivalent plastic strain increment $\Delta\epsilon2$ is generated in the second connection layer 60. The equivalent plastic strain increment $\Delta\epsilon2$ is defined by a formula $\Delta\epsilon2=(0.0075b2+0.0003)a2^2+0.03$. The formula defining the $\Delta\epsilon2$ is a formula obtained by fitting, to a function, an equivalent plastic strain increment calculated by computer simulation with the length a2 and the thickness b2 as variables.

Sizes of the IGBT 10 and the MOSFET 20, that is, the length a1 of each side of the square shape of the IGBT 10, the thickness b1 of the IGBT 10, the length a2 of the each side of the square shape of the MOSFET 20, and the thickness b2 of the MOSFET 20 are respectively set so as to satisfy a relation of $\Delta\epsilon1>\Delta\epsilon2$. Specifically, as shown in FIG. 5, the relation of $\Delta\epsilon1>\Delta\epsilon2$ is achieved when b1 is equal to b2 (b1=b2), the length a1 of the IGBT 10 is set as D1 and the length a2 of the MOSFET 20 is set as D2.

Next, effects achieved by employing the semiconductor device 100 according to the present disclosure will be described.

When the semiconductor device 100 according to the present embodiment is employed, the amount of strain generated in the first connection layer 50 is greater than the second connection layer 60. As a result, increment of thermal resistance of the first connection layer 50 is greater than that of the second connection layer 60. That is, a specific life ends in the first connection layer 50 prior to the second connection layer 60. Namely, a designer can intentionally control the first connection layer 50 to end the life earlier than the second connection layer 60. When the temperature detector is formed only in the IGBT 10, which is the first element connected to the first connection layer 50, and the thermal protection of the elements are performed based on the detected temperature, the MOSFET 20, which is the second element, is restricted to be broken prior to the IGBT 10.

Accordingly, the temperature detector needs not to be formed in the MOSFET 20, which is formed of silicon carbide, and thus a chip size of the element formed of silicon carbide as a main constituent is miniaturized. Generally, silicon carbide is more expensive than silicon. Therefore, by employing the semiconductor device 100 of the present embodiment, the chip size of the element formed of silicon carbide as a main constituent is restricted from being increased and costs for manufacturing the semiconductor device 100 is reduced.

Modification 1

In the first embodiment, the semiconductor device having one IGBT 10 as the first element and one MOSFET 20 as the second element is described. However, the semiconductor device may have multiple elements disposed between a pair of the first heat sink 30 and the second heat sink 40.

Figure 6:
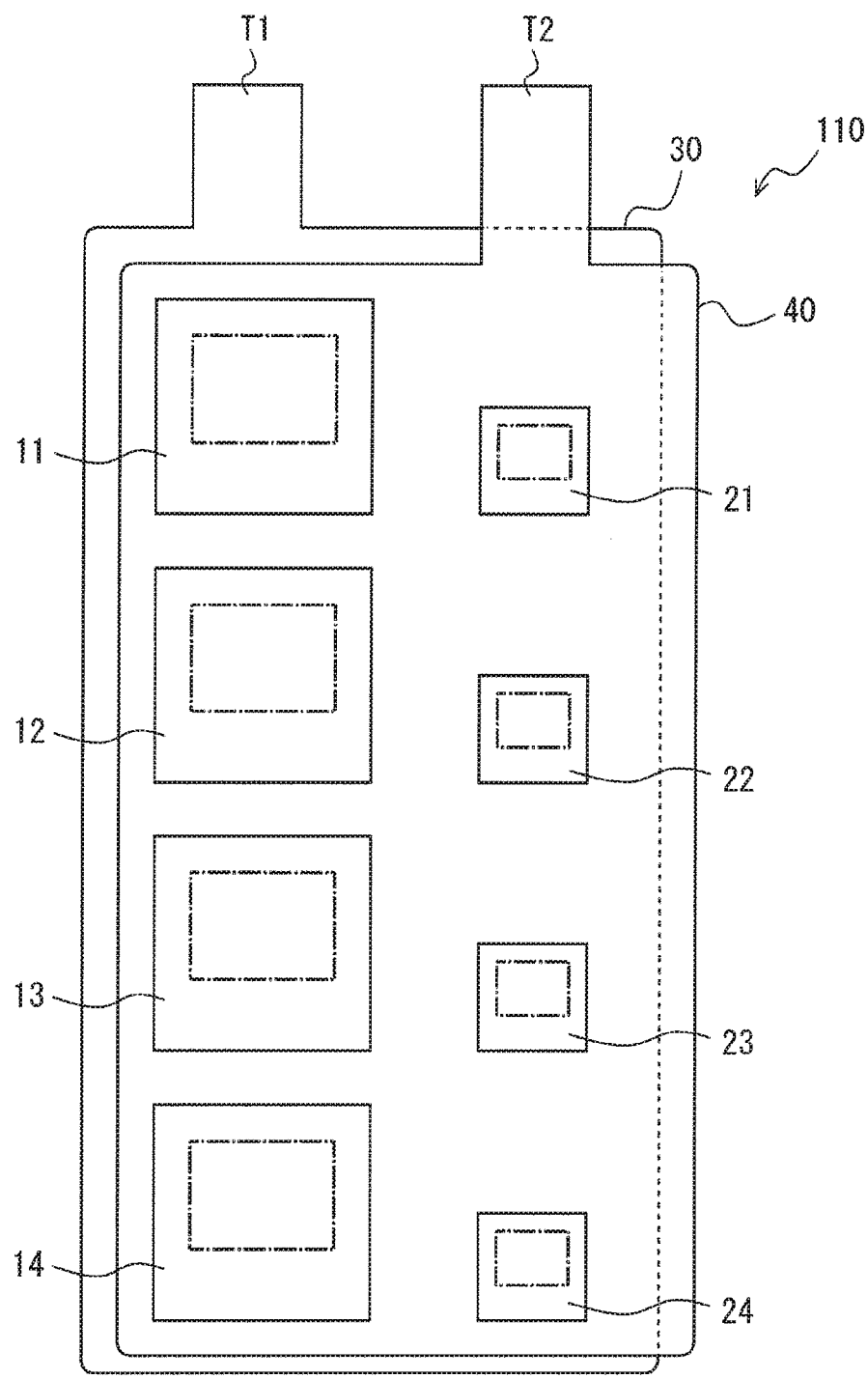
FIG. 6 is a top view illustrating a schematic structure of a semiconductor device according to a modification 1.

For example, as shown in FIG. 6, a semiconductor device 110 having four IGBTs (i.e., IGBT 11 to IGBT 14) and four MOSFETs (i.e., MOSFET 21 to MOSFET 24) will be described. In the semiconductor device 110, the IGBTs 11 to 14 and the MOSFETs 21 to 24 are disposed on the first heat sink 30 through corresponding connection layers. The second heat sink 40 is connected to the emitter electrodes or the source electrodes of the elements through corresponding spacers. That is, similarly to the first embodiment, the first heat sink 30 and the second heat sink 40 are disposed to face with each other. Although the illustration of the driver 300 is omitted in FIG. 6, the driver 300 supplies gate voltage to the gate electrodes of the IGBTs 11 to 14 and the MOSFETs 21 to 24.

The equivalent plastic strain increments of the IGBT 11 to the IGBT 14 applying the stress to the corresponding connection layers are expressed as $\Delta\epsilon11$ to $\Delta\epsilon14$. The equivalent plastic strain increments of the MOSFET 21 to the MOSFET 24 applying the stress to the corresponding connection layers are expressed as $\Delta\epsilon21$ to $\Delta\epsilon24$.

When the maximum value of the equivalent plastic strain increments of $\Delta\epsilon11$ to $\Delta\epsilon14$ is expressed as $\Delta\epsilon1max$, and the maximum value of the equivalent plastic strain increments of $\Delta\epsilon21$ to $\Delta\epsilon24$ is expressed as $\Delta\epsilon2max$, sizes of the IGBTs 11 to 14 and the MOSFETs 21 to 24 are respectively set so as to satisfy a relation of $\Delta\epsilon1max>\Delta\epsilon2max$.

As a result, the thermal resistance of the connection layer corresponding to one of the IGBT 11 to IGBT 14 exceeds a threshold for determining malfunction prior to the MOSFET 21 to the MOSFET 24. Therefore, the temperature detector needs not to be formed in the MOSFETs and thus the chip size of the element formed of silicon carbide as a main constituent is miniaturized.

Other Embodiments

Although the embodiment of the present disclosure is described hereinabove, the present disclosure is not limited to the embodiment described above and may be implemented in various other ways without departing from the gist of the present disclosure.

In the above embodiment and the modification, the example is described in which the first element is formed of silicon and the second element is formed of silicon carbide.

However, the present disclosure is not limited to the example. For example, even when the second element is formed of silicon, the effects, in which the temperature detector needs not to be formed in the second element, are achieved. Since the temperature detector is not formed, the whole size of the semiconductor device is miniaturized.

However, when the second element is formed of the wide band-gap semiconductor, effects such as low on-resistance, increase of the temperature at which the operation is secured, and increase of switching speed of the element are achieved. Therefore, it is more preferable to employ the structure of the above embodiment and the modification while employing the wide band-gap semiconductor as the constituent of the second element.

Galium nitiride or galium oxide may be employed as the wide band-gap semiconductor other than silicon carbide.

In the above embodiment and the modification, so-called double heat dissipating type semiconductor device is described in which the IGBTs 10 to 14 and the MOSFETs 20 to 24 are sandwiched between the two heat sinks 30 and 40. The present disclosure may be adapted to a single heat dissipating type semiconductor device. Even in the semiconductor device that does not have the second heat sink 40, the first spacer 70, the second spacer 80, the third connection layer 71, the fourth connection layer 72, the fifth connection layer 81 and the sixth connection layer 82, compared to the first embodiment, the sizes of the IGBT 10 and the MOSFET 20 are set so that the equivalent plastic strain increment of the first connection layer is greater than the equivalent plastic strain increment of the second connection layer.

While only the selected exemplary embodiments have been chosen to illustrate the present disclosure, the present disclosure is not limited to the said embodiments and structures. Various changes and modification can be made in the present disclosure. Furthermore, various combination and formation, and other combination and formation including one, more than one or less than one element can be made in the present disclosure.

The invention claimed is:

1. A semiconductor device comprising:
   at least one first element formed of a first constituent as a main constituent, the at least one first element having electrodes at a front surface and a rear surface opposite to the front surface;
   at least one second element formed of a second constituent different from the first constituent as a main constituent, the at least one second element having electrodes at a front surface and a rear surface opposite to the front surface;
   a heat sink on which the at least one first element and the at least one second element are disposed;
   a first connection layer electrically connecting the electrode at the rear surface of the at least one first element to the heat sink;
   a second connection layer electrically connecting the electrode at the rear surface of the at least one second element to the heat sink; and
   a mold resin covering and protecting the at least one first element, the at least one second element and the heat sink, wherein
   a part of a surface of the heat sink is exposed from the mold resin, and
   sizes of the at least one first element and the at least one second element are set so that an equivalent plastic strain increment of the first connection layer is greater than an equivalent plastic strain increment of the second connection layer.

2. The semiconductor device according to claim 1, wherein
   the heat sink includes a first heat sink and a second heat sink,
   the first connection layer is interposed between the at least one first element and the first heat sink,
   the second connection layer is interposed between the at least one second element and the first heat sink,
   the second heat sink is disposed to face the first heat sink,
   the second heat sink is connected to the electrode at the front surface of the at least one first element through a first spacer,
   the second heat sink is connected to the electrode at the front surface of the at least one second element through a second spacer, and
   a part of a surface of the second heat sink is exposed from the mold resin.

3. The semiconductor device according to claim 2, wherein
   each of the front surface and the rear surface of the at least one first element and the front surface and the rear surface of the at least one second element has a square shape each side of which has a length equal to or more than 2 millimeters,
   each of the at least one first element and the at least one second element has a thickness equal to or more than 0.1 millimeters,
   the at least one first element is formed of silicon as the main constituent,
   the at least one second element is formed of silicon carbide as the main constituent,
   the first heat sink, the second heat sink, the first spacer and the second spacer are formed of copper as a main constituent,
   the length of each side of the square shape of the front surface and the rear surface of the at least one first element is expressed as a1,
   the thickness of the at least one first element is expressed as b1,
   the length of each side of the square shape of the front surface and the rear surface of the at least one second element is expressed as a2,
   the thickness of the at least one second element is expressed as b2,
   the equivalent plastic strain increment of the first connection layer is expressed as $\Delta\epsilon 1$ and defined by $\Delta\epsilon 1 = (0.004b1+0.0003)a1^2+0.26$,
   the equivalent plastic strain increment of the second connection layer is expressed as $\Delta\epsilon 2$ and defined by $\Delta\epsilon 2 = (0.0075b2+0.0003)a2^2+0.03$, and
   the a1, b1, a2 and b2 are set so as to satisfy a relation of $\Delta\epsilon 1 > \Delta\epsilon 2$.

4. The semiconductor device according to claim 1, wherein
   the at least one first element includes a plurality of first elements,
   a maximum value of the equivalent plastic strain increments of the first connection layers corresponding to the plurality of first elements is expressed as $\Delta\epsilon 1max$,
   the equivalent plastic strain increment of the second connection layer of the at least one second element is expressed as $\Delta\epsilon 2max$, and
   sizes of the plurality of first elements and the at least one second element are set so as to satisfy a relation of $\Delta\epsilon 1max > \Delta\epsilon 2max$.

5. The semiconductor device according to claim 1, wherein:

the at least one second element includes a plurality of second elements, the equivalent plastic strain increment of the first connection layer of the at least one first element is expressed as $\Delta\epsilon 1max$, a maximum value of the equivalent plastic strain increments of the second connection layers corresponding to the plurality of second elements is expressed as $\Delta\epsilon 2max$, and sizes of at least one first element and the plurality of second elements are set so as to satisfy a relation of $\Delta\epsilon 1max > \Delta\epsilon 2max$.

6. The semiconductor device according to claim 1, wherein:

the at least one first element includes a plurality of first elements, the at least one second element includes a plurality of second elements, a maximum value of the equivalent plastic strain increments of the first connection layers corresponding to the plurality of first elements is expressed as $\Delta\epsilon 1max$, a maximum value of the equivalent plastic strain increments of the second connection layers corresponding to the plurality of second elements is expressed as $\Delta\epsilon 2max$, and sizes of the plurality of first elements and the plurality of second elements are set so as to satisfy a relation of $\Delta\epsilon 1max > \Delta\epsilon 2max$.

* * * * *